United States Patent
Rostron et al.

(10) Patent No.: US 11,489,335 B2
(45) Date of Patent: Nov. 1, 2022

(54) ARRESTER TEMPERATURE MONITOR

(71) Applicants: Joseph R Rostron, Hampton, GA (US); Josh Keister, Hampton, GA (US); Raj Anand, Hampton, GA (US)

(72) Inventors: Joseph R Rostron, Hampton, GA (US); Josh Keister, Hampton, GA (US); Raj Anand, Hampton, GA (US)

(73) Assignee: Southern States LLC, Hampton, GA (US)

( * ) Notice: Subject to any disclaimer, the term of this patent is extended or adjusted under 35 U.S.C. 154(b) by 0 days.

(21) Appl. No.: 17/382,419

(22) Filed: Jul. 22, 2021

(65) Prior Publication Data

US 2021/0350960 A1   Nov. 11, 2021

Related U.S. Application Data

(63) Continuation of application No. 15/788,520, filed on Oct. 19, 2017, now abandoned.
(Continued)

(51) Int. Cl.
*H02H 9/04* (2006.01)
*G01R 31/12* (2020.01)
(Continued)

(52) U.S. Cl.
CPC ........... *H02H 9/04* (2013.01); *G01R 31/1236* (2013.01); *G01J 5/0096* (2013.01); *G01K 1/024* (2013.01);
(Continued)

(58) Field of Classification Search
CPC ......... G01J 5/0096; G01K 1/024; G01K 1/14; G01K 2215/00; G01K 5/48; G01L 1/005;
(Continued)

(56) References Cited

U.S. PATENT DOCUMENTS 9,442,138 B2 *  9/2016  Rostron ............... G01R 15/16
10,274,379 B2 *  4/2019  Khatri ..................... G01K 1/14
(Continued)

FOREIGN PATENT DOCUMENTS

CN          112782458 A  *  5/2021
DE      102017200125 B3  *  3/2018  ......... G01R 31/1236

*Primary Examiner* — Jared Fureman
*Assistant Examiner* — Nicolas Bellido
(74) *Attorney, Agent, or Firm* — Mehrman Law Office; Michael J. Mehrman

(57) ABSTRACT

An instrumented electric power voltage arrester includes a temperature sensor, wireless transmitter, and a visual over-temperature indicator. A disk shaped module, a replacement varister block, or a dummy block containing the sensor/transmitter is placed between varister blocks inside the arrester housing. A strap-on module is attached to the outside of the arrester housing. The sensor/transmitter utilizes a harvesting power supply that draws electric power for the electronics from the power line protected by the arrester. An ambient temperature sensor may be utilized to enhance accuracy. The temperature sensor/transmitter typically sends arrester monitoring data wirelessly to an RTU or handheld unit located outside the arrester, which relays the monitoring data to an operations control center that scheduled replacement of the arrester based on the monitoring data. A surge counter keeps track of the number of equipment and lightning related temperature surges experienced by the arrester.

20 Claims, 11 Drawing Sheets

Related U.S. Application Data

(60) Provisional application No. 62/410,262, filed on Oct. 19, 2016.

(51) Int. Cl.

| | |
|---|---|
| *G01K 1/024* | (2021.01) |
| *G01K 1/14* | (2021.01) |
| *G08C 17/02* | (2006.01) |
| *H01C 7/12* | (2006.01) |
| *G01J 5/00* | (2022.01) |
| *G01K 5/48* | (2006.01) |
| *G01L 1/00* | (2006.01) |
| *G01R 19/00* | (2006.01) |

(52) U.S. Cl.
CPC ............... *G01K 1/14* (2013.01); *G01K 5/48* (2013.01); *G01K 2215/00* (2013.01); *G01L 1/005* (2013.01); *G01R 19/0092* (2013.01); *G08C 17/02* (2013.01); *H01C 7/12* (2013.01)

(58) Field of Classification Search
CPC ............ G01R 19/0092; G01R 31/1236; G08C 17/02; H01C 7/12; H02H 9/04; H02H 9/042

See application file for complete search history.

(56) References Cited

U.S. PATENT DOCUMENTS

| | | | |
|---|---|---|---|
| 2014/0158665 A1* | 6/2014 | McCord | H01H 9/04 335/154 |
| 2016/0265978 A1* | 9/2016 | Khatri | G01K 1/14 |
| 2018/0017610 A1* | 1/2018 | Phillips | G01R 31/1236 |

\* cited by examiner

ARRESTER TEMPERATURE MONITOR

REFERENCE TO RELATED APPLICATION

This application claims priority to commonly owned U.S. patent application Ser. No. 15/788,520 filed Oct. 19, 2017, which claims priority to U.S. Provisional Application Ser. No. 62/410,262 filed on Oct. 19, 2016, which are incorporated by reference.

TECHNICAL FIELD

The present invention is directed to electric power systems and, more particularly, to an electric power voltage surge arrester containing a temperature sensor, wireless transmitter and visual indication of arrester status.

BACKGROUND

A voltage surge arrester is a device used on electric power systems to protect the insulation and conductors of the system from the damaging effects of switching and other transient voltage surges. An arrester is typically located in the supply side of a protected load, such as a piece of equipment or distribution segment, to protect the load from voltage surges. The arrester includes an internal voltage-variable resistor known as a "varister" that conducts an electric current when the voltage across the arrester reaches a certain voltage to effectively limit the voltage experienced by the protected load to that voltage. A failed arrester behaves like an open circuit exposing the protected bad to transient voltage surges without the protective voltage limiting effect of the arrester.

Arrester failures are among the most common causes of power outages in electric transmission and distribution systems. Although arrester failure may result from a number of causes, an increase in the internal temperature of the arrester often provides an early warning of impending failures. This is because increasing leakage current through the arrester creates heat that tends to build up until complete failure occurs. Arrester failure can cause local voltage overloads resulting in faults on the system that must be isolated and cleared. Most commonly, arrester failure results in local power outages and lost service to customers as well as expensive field service crews to replace the arrester to return the network to full service.

Conventional maintenance practices involve periodic arrester monitoring with heat detecting infrared (IR) cameras. This is time consuming, difficult because a temperature difference of only a few degrees difference can be an early indication of impending arrester failure. This is problematic because this level of temperature difference is so low that solar heating and other ambient conditions can mask real problems and trigger "false alarm" arrester replacement. This problem is acerbated by the fact that the vast majority of arrester failures result from moisture getting into the arrester housing, which shorts out several varister blocks causing sustained overvoltage on the other blocks. It is difficult, of course, to conduct arrester monitoring during severe when the electric distribution system experiences the highest level of lightning strikes and weather related outages. Even aggressive monitoring during fair weather therefore fails to detect the most common causes of arrester failure. Arresters therefore continue to be a major cause of unplanned outages and transient voltage related power quality events requiring repair activities at any time of day or night. There is, therefore, a need for a more effective approach for electric power voltage arrester monitoring and replacement.

SUMMARY

The present invention may be embodied in a temperature sensor/transmitter for an electric power voltage surge arrester, an associated instrumented voltage surge arrester, and an associated operation and maintenance system. The electric power voltage surge arrester includes a temperature sensor, wireless transmitter, and a visual over-temperature indicator. There are several illustrative examples of the temperature sensor/transmitter including a disk shaped module configured to be placed between varister blocks inside the arrester housing, a replacement varister block containing the sensor/transmitter, and a strap-on module configured to be attached to the outside of the arrester housing. The sensor/transmitter may utilize a harvesting power supply that draws electric power for the electronics from the power line protected by the arrester. The sensor/transmitter may also utilize an ambient temperature sensor to enhance accuracy of its temperature measurements.

The temperature sensor/transmitter typically sends arrester monitoring data wirelessly to a remote transmission unit (RTU) or handheld unit located outside the arrester, which relays the monitoring data to an operations control center that schedules replacement of the arrester based on the monitoring data. The sensor/transmitter may also implement a dynamic data transmission cycle that automatically adjusts to the time required to harvest transmission power.

The instrumented electric power voltage arrester or an associated device may also include a surge counter configured to count a number of temperature surges experienced by the arrester. The surge counter may also count a number of equipment related temperature surges and a number of lightning related temperature surges experienced by the arrester.

It will be understood that specific embodiments may include a variety of features in different combinations, as desired by different users. In view of the foregoing, it will be appreciated that the present invention provides a cost effective temperature sensor/transmitter for an electric power voltage surge arrester, an associated instrumented voltage surge arrester, and an associated operation and maintenance system. The specific techniques and structures for implementing particular embodiments of the invention and accomplishing the associated advantages will become apparent from the following detailed description of the embodiments and the appended drawings and claims.

BRIEF DESCRIPTION OF THE FIGURES

The numerous advantages of the invention may be better understood with reference to the accompanying figures in which.

DETAILED DESCRIPTION

Figure 1:
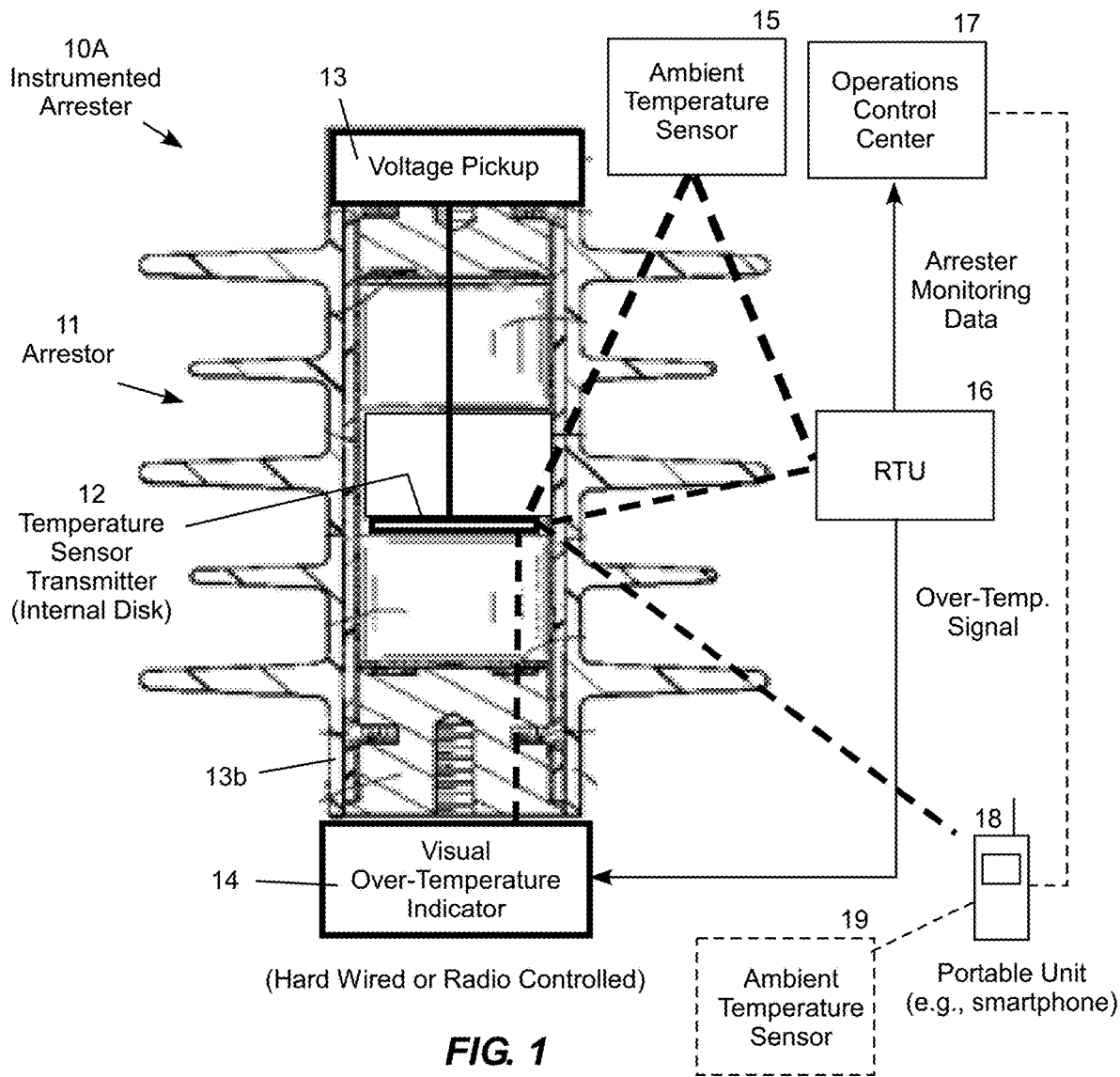
FIG. 1 is conceptual illustration of an instrumented electric power voltage arrester including an internal disk temperature transmitter/sensor.

Embodiments of the invention include a temperature sensor/transmitter for an electric power voltage surge arrester, an associated instrumented voltage surge arrester, and an associated operation and maintenance system. The electric power voltage surge arrester provides a cost effective solution for continuously monitoring arrester temperature to detect an elevated risk of arrester failure. Autonomous continual monitoring helps to eliminate unexpected arrester failure and unnecessary replacements. Arresters are typically made of housings with a series of internal Zinc Oxide varister blocks in series from line voltage to ground. These varister blocks are the active elements that limit voltage surges on power systems. In various embodiments, a temperature sensor is added as a replacement block into the varister stack, a disk-shaped sensor positioned between varister blocks, or strapped to the arrester housing adjacent to the varister stack. The sensor includes a harvesting power supply that draws electricity to power the electronics from the power line and a wireless transmitter that communicates the arrester monitoring data to an external device, such as a remote transmission unit (RTU) or handheld interrogator. The RTU or handheld interrogator typically relays the arrester monitoring data on to an operations control center, which schedules replacement of the arrester as indicated by the arrester monitoring data. The arrester monitor may also utilize an ambient temperature monitor to help distinguish temperature variations due to leakage current from ambient temperature changes. A surge counter keeps track of the number of equipment and lightning related temperature surges experienced by the arrester.

It will be appreciated that wireless transmissions emanating from inside the central canister formed by the arrester housing are not blocked by the arrester housing (bells) because the housing is constructed from a non-conducting insulator material. Temperature sensors located inside the arrester housing may more precisely measure the actual temperature of the arrester blocks, while an external sensor may be more easily installed without taking the arrester out of service. Measuring ambient temperature helps to improve the accuracy of the external strap-on sensor.

The sensor block may be installed near the center of the arrester as the ends are frequently cooler because of the cooling that comes from the attachments for mechanically supporting the arrester assembly. The sensors typically harvest power for the electronics from voltage pickups located in the high voltage electric field produced by the power line. Other types of harvesting power supplies may be used, such those that induce electricity from an external RF energy beam or the magnetic field produced by the power line. Another option includes harvesting the trickle of current that normally passes through the internal varister stack of the arrester. Energy may also be harvested from the electrostatic field between the sensor to ground by virtue of capacitive coupling between a capacitive foil insulated from the sensor, which could be housed in a cylindrical puck.

The present invention may be embodied in an instrumented electric power voltage arrester including a temperature sensor, wireless transmitter, and a visual over-temperature indicator. There are several illustrative examples of the temperature sensor/transmitter including a disk shaped module configured to be placed between varister blocks inside the arrester housing, a replacement varister block containing the sensor/transmitter, and a strap-on module configured to be attached to the outside of the arrester housing. The sensor/transmitter may utilize a harvesting power supply that draws electric power for the electronics from the power line protected by the arrester. The sensor/transmitter may also utilize an ambient temperature sensor to enhance accuracy of its temperature measurements.

The temperature sensor/transmitter typically sends arrester monitoring data wirelessly to an RTU or handheld unit located outside the arrester, which relays the monitoring data to an operations control center that scheduled replacement of the arrester based on the monitoring data. The sensor/transmitter may also implement a dynamic data transmission cycle that automatically adjusts to the time required to harvest transmission power.

The visual indicator may resemble a bracelet placed around the arrester housing between the "weather sheds." This type of visual indicator can be easily installed over an existing arrester insulator. This bracelet may carry one or more patch antennas suitable for bidirectional RF communications and receiving power for the LED indicator lights. These patches can also be used to harvest energy from the electrostatic electrical field. A bracelet placed on the arrester insulator without other connections will be electrically "floating." Since the top of the arrester is at line voltage and the bottom is at ground, the bracelet will be closely coupled to the power line voltage gradient with an intermediate voltage related to the point on the arrester where the bracelet is placed. This will cause capacitive currents through the housing insulation predominated by the voltage of the arrester at the point where the arrester is located. The stray capacitance to ground will cause a slight shift in this voltage but since this is not a voltage monitor, it will not cause any undesirable issue. Alternatively, energy can be scavenged by having two partially circumferential rings under the edges of this bracelet and using the voltage difference between them to provide sensor power. This uses the voltage gradient along the internal arrester blocks to provide a differential voltage between these rings. These rings will be capacitive coupled to the arrester at the local voltage where the sensor in mounted. This has the advantage of being in close proximity to the arrester where it is easier to obtain the needed energy. With this approach, the bracelet can be placed near the bottom of the arrester where the LED's or other visible indicator allowing technicians in the field to easily see which arrester is indicating a problem.

The arrester monitoring data from these sensors is collected periodically to measure temperature differences, trends and rapidly changing conditions. From this information, an arrangement of measurements and other data can be utilized to schedule maintenance and provide alarms and indications of impending equipment failures. This information is collected by the multiple arresters to uniquely identify specific arresters for careful monitoring and replacement at a time when they can be replaced with minimal disruption to customer service. This allows scheduled arrester replacement based on continual temperature monitoring rather than emergency replacement driven by arrester failure.

The temperature sensor may be a resistance temperature detector (RTD), surface acoustic wave (SAW), thermocouple, or any other suitable type of temperature sensor. RTD sensors are accurate and inexpensive, while SAW sensors are passive devices having the advantage of requiring no power to sense temperature. A SAW sensor can is typically read when illuminated by a signal from a reader, which receives and interprets energy reflected from the sensor. The antenna/sensors may have a unique identity code built into the sensor for identification of the sensor and associated arrester. Powered arrangements can harvest energy to run active transmitters and use thermocouples, RTD or other approaches to sense the temperature.

FIG. 1 is conceptual illustration of an instrumented electric power voltage arrester 10A including an arrester 11 carrying an internal disk temperature sensor/transmitter 12 powered by a voltage pickup 13 that harvests electricity from the electric power line 5 protected by the arrester. The sensor/transmitter 12 communicates wirelessly through a wired link with a visual over-temperature indicator 14 that illuminates light-emitting diodes (LEDs) to indicate a detected over-temperature condition. The instrumented electric power voltage arrester may also utilize an ambient temperature sensor 15 to enhance the detection of a temperature change detected by the sensor/transmitter 12 caused by an increase in leakage current through the arrester as opposed to changes in the ambient temperature. The sensor/transmitter 12 communicates arrester monitoring data to an external device, in this example a remote transmission unit (RTU) 16, which relays data to an operations control center 17 that schedules maintenance including replacement of the arrester when indicated by the arrester monitoring data. The sensor/transmitter 12 may also communicate with a portable unit 18, such as a smartphone or similar portable device, which relays the operations control center 17. The portable unit 18 may include its own ambient temperature sensor 19.

The sensor/transmitter 12 continually supplies the control center 17 with arrester monitoring data allowing the control center to detect impending arrester failure presaged by a detected increase the temperature of the arrester. This allows arrester replacement to be planned and scheduled, typically during an off-peak, nighttime or weekend period when the protected load is inactive, without waiting for the arrester to fail unexpectedly. In addition to providing continual autonomous temperature monitoring, the temperature sensor/transmitter 12 which is physically connected to the arrester 11 provides improved accuracy over conventional infrared (IR) readers used to occasionally measure the arrester temperature from a distance. This reduces the occurrence of "false alarm" replacement of properly functioning arresters. False alarms are a persistent problem with conventional arrester maintenance because a relatively low temperature change caused by leakage current through the arrester, in the range of three degrees Celsius, typically indicates an increased risk of failure. This relatively small temperature difference can be easily triggered or masked by solar heating, rain, wind or other ambient conditions.

The arrester 11 includes a hollow cavity filled with a stack of varister blocks separated insulator spacers electrically connected between the protected power line 5 and electric ground 6. Many arresters can be opened to remove and replace the varister blocks, which are typically stacked on a central tube and compressed together with a spring. The disk-type temperature sensor/transmitter 12 in this embodiment, with a size that is similar to a spacer, is configured to be positioned within the varister stack either instead of or in addition to a spacer. This configuration allows the disk-type temperature sensor/transmitter 12 to be built into an arrester as original equipment, or as a retrofit component added to a pre-existing arrester. In addition, the arrester may contain multiple disk-type temperature sensor/transmitters, for example between every other varister block such that at least one sensor/transmitter is positioned adjacent to each varister block. This may be an advantageous configuration because each varister block can fail independently of the other blocks.

There are a number of electric power harvesting techniques available to power the electronics of the sensor/transmitter because the arrester is located in the high voltage electro-magnetic field of the power line with a large voltage gradient across the arrester from line potential at the power line 5 at the top of the arrester to electric ground 6 at the bottom of the arrester. For example, the voltage pickup 13 may include two electrodes spaced apart radially (horizontal on FIG. 1) or laterally (vertical on FIG. 1). In either case, electrodes separated by only a few centimeters in the high voltage gradient experienced by the arrester (e.g., 34.5 kV, 69 kV) is sufficient to harvest a few Volts sufficient to power the electronics of the sensor/transmitter (e.g., 5 Volts). The voltage pickup, which may be located in any desired position on the arrester, is depicted attached near the end of the arrester for illustrative convenience. For example, the voltage pickup may be positioned on the outside of the arrester housing 7 adjacent to the sensor/transmitter 12. The voltage pickup may be positioned on the sensor/transmitter 12 as a self-contained harvesting power supply to avoid the need for a wired connection from the voltage pickup to the sensor/transmitter. Configuring the sensor/transmitter 12 with a self-contained harvesting power supply and wireless transmitter provides an important advantage by avoiding the need for wired connections from external components to the sensor/transmitter.

The visual over-temperature indicator 14 can communicate with the sensor/transmitter 12 through a wired or wireless link, either directly or indirectly (e.g., through the RTU 16). As a result, the visual indicator may be positioned in any suitable position on or off the arrester 11. While the bottom of the arrester is a convenient and intuitive location for technicians visually inspecting the arrester, the visual indicator could be located on a control panel, transmitted to a remote unit, or any other suitable location. While any type of visible, audible or other indicator may be used, LEDs are durable, low power, inexpensive and well suited for this purpose. The indicator may be attached to the arrester in any suitable way. For example, one option is a resilient band that can be twisted or stretched to fit onto the arrester. Another option is a two-piece bracelet style with a hinge and hasp. Another option is a half-circle rigid band with eyelets on either end fastened to the arrester with a heavy-duty cable tie, Velcro strap or band clamp. Another option is two half-circle rigid bands that snap fit into each other. The indicator could also be configured on a stainless steel strap similar to the strap 91 for the sensor/transmitter shown in FIG. 9. A mechanism may be provided to tighten the strap, such as a band clamp or ratchet. Any other suitable attachment mechanism may be used as a matter for design choice.

The ambient temperature sensor 15 or 19 may be located in any suitable location that reliably represents the ambient temperature at the arrester 11. The sensor/transmitter 12 or other device that determines over-temperature alarm conditions may use the temperature measured by the sensor/transmitter independently, with respect to the detected temperature, or both. The temperature sensor/transmitter 12 shown in FIG. 1 located inside the arrester will be less sensitive to the ambient temperature than the external sensor/transmitter shown in FIGS. 9-11. An internal sensor/transmitter may therefore utilize the temperature measured by the sensor/transmitter independently, while an external sensor/transmitter may utilize the temperature measured by the sensor/transmitter with respect to the ambient temperature.

Distribution and transmission substations typically have preexisting RTUs as part of the Supervisory Control and Data Acquisition (SCADA) used by most electric utilities. The RTU 16 and the Operation and Control Center 17 may therefore be part of a preexisting SCADA system. As all of these components are functionally connected, the software that determines over-temperature alarms from the measured parameters may therefore be located in the sensor/transmitter 12, the visual indicator 14, the RTU 16, the Operation and Control Center 17, the portable unit 18, or any other suitable location. These components may be connected to each other through wired or wireless links, as desired. The portable unit 18 allows data collection from arresters outside of substations, such as locations along power lines, at tap points, transformers capacitors, voltage regulators, customer service points, and so forth.

Figure 2:
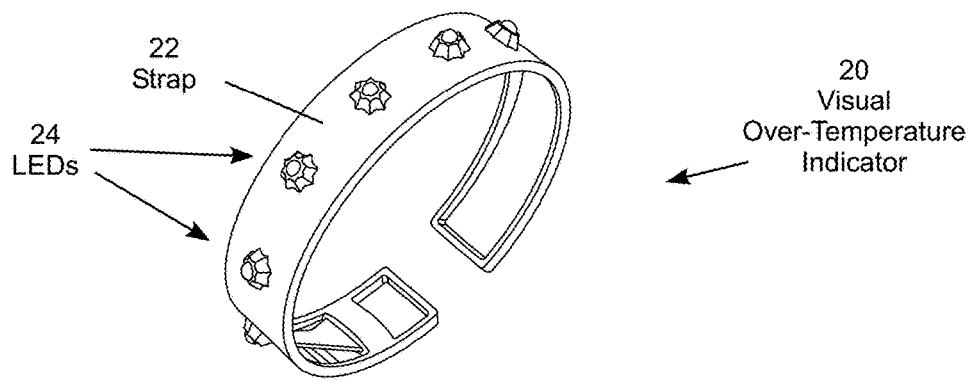
FIG. 2 is a conceptual illustration of a visual over-temperature indicator for the instrumented arrester.

FIG. 2 is a conceptual illustration of a visual over-temperature indicator 20 for the instrumented arrester. This particular example includes a strap 22 carrying a number of LEDs 24 and a wired connection or wireless receiver for communicating with a device supplying an over-temperature alarm signal, typically the sensor/transmitter 12 or the RTU 16. The bracelet-type indicator 20 can be easily attached to the outside of the arrester or a nearby location. The indicator 20 may receive power from the voltage pickup, the sensor/transmitter, the RTU, an onboard harvesting power supply, a battery, or any other suitable power source. In the embodiment shown in FIG. 1, a wired connection between the RTU 16 and the visual indicator 20 can provide both signal and power supply.

Figure 3:
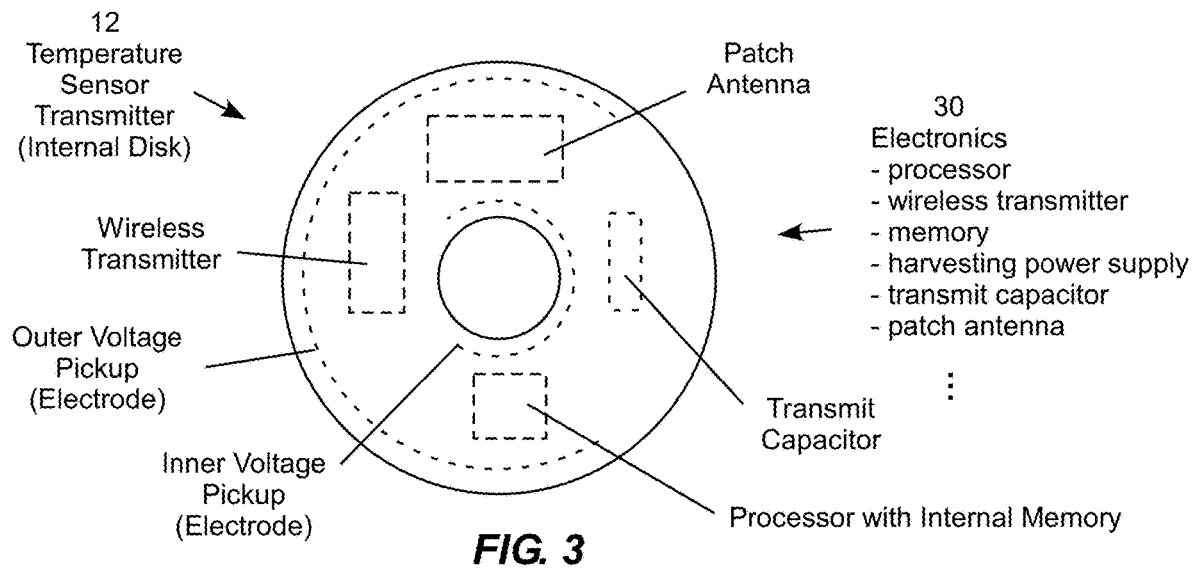
FIG. 3 is a conceptual top view illustration of the internal disk temperature transmitter/sensor.

FIG. 3 is a conceptual top view illustration of the internal disk temperature sensor/transmitter 12. The sensor/transmitter has a disk shape with a hole in the center allowing the disk to be received on the center tube of the arrester. The sensor/transmitter is similar in size to the spacer typically located between varister blocks in the stack contained within the arrester housing. The sensor/transmitter includes PC board with embedded electronics 30, typically including a processor, wireless transmitter, memory, harvesting power supply, transmit capacitor, patch antenna, and so forth. The harvesting power supply charges a transmit capacitor until it holds a sufficient charge to power a wireless data transmission.

Figure 4:
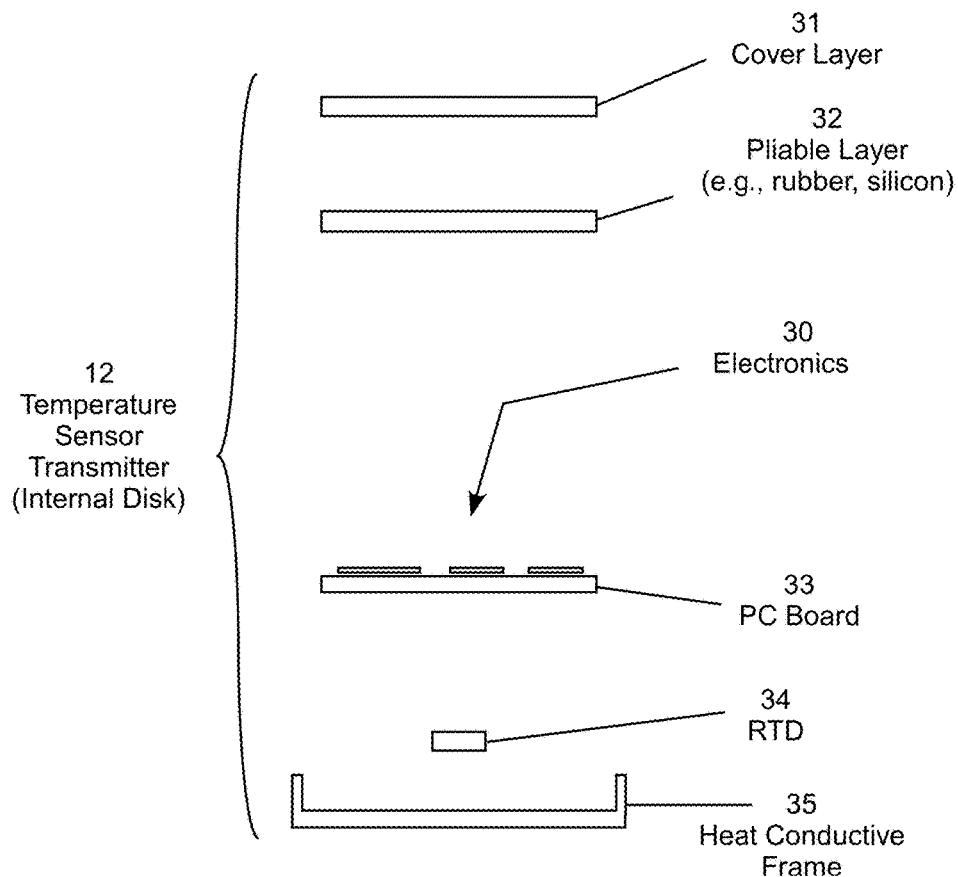
FIG. 4 is a conceptual exploded side view illustration of the internal disk temperature transmitter/sensor.

FIG. 4 is a conceptual exploded side view illustration of the internal disk temperature sensor/transmitter 12. The disk includes a cover layer 31 which may be a PC board, plastic or other dielectric material. A pliable layer 32 under the cover layer 31 protects the underlying PC board 33 carrying the electronics. A temperature sensor, such as a solid state resistance temperature detector (RTD) 34 is located between the PC board 33 and a heat conductive frame 35, such as an aluminum frame. The spring in the arrester stack compressing the varister stack also compresses the heat conductive frame 35 against the adjacent varister block for a reliable temperature reading by the RTD. While an RTD is utilized in this embodiment, other types of temperature sensors may be used, such as a surface acoustic wave (SAW) sensor, a thermocouple, or any other suitable thermal sensor.

Figure 5:
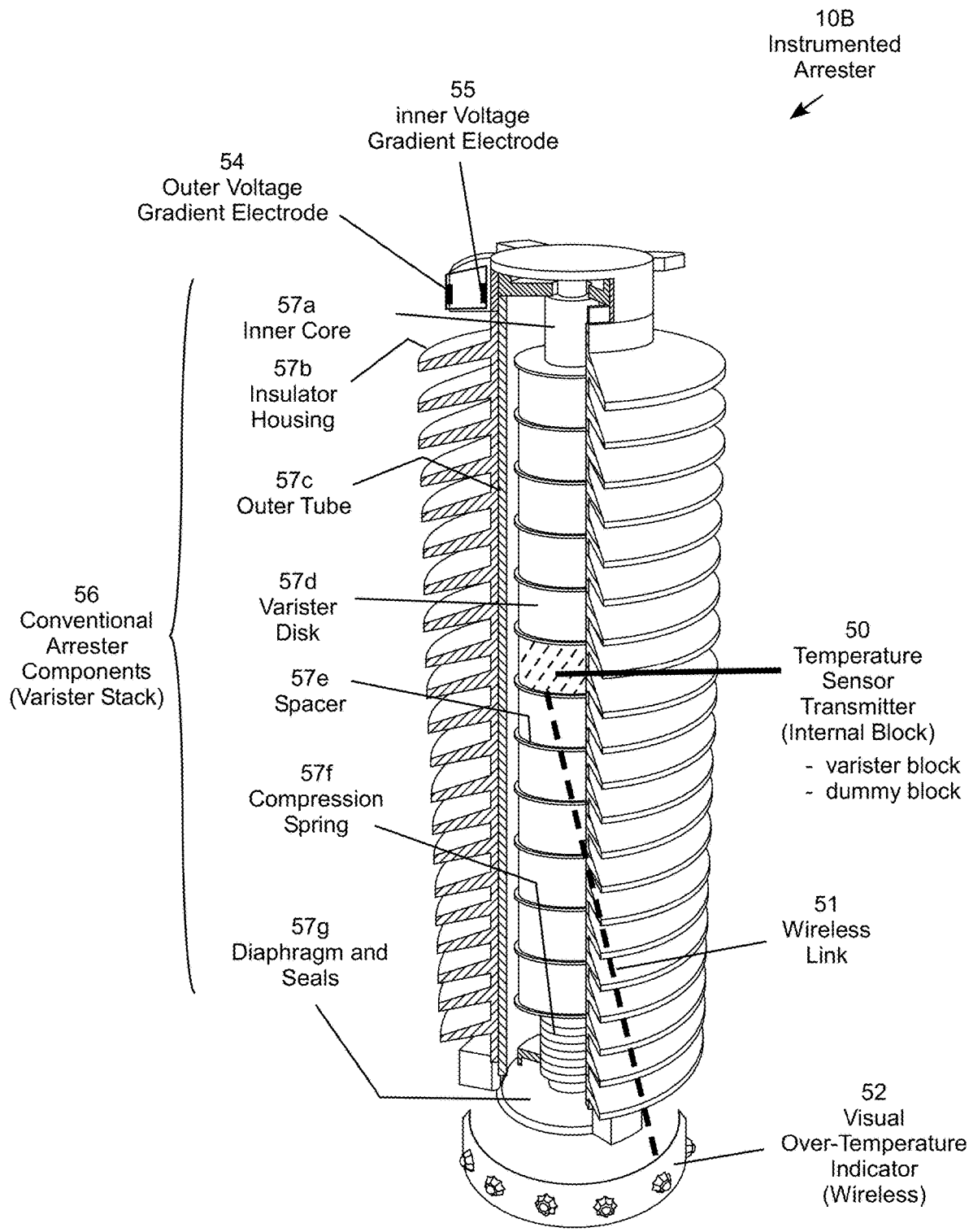
FIG. 5 is conceptual illustration of an instrumented electric power voltage arrester including an internal block temperature sensor with a wireless visual over-temperature indicator.

FIG. 5 is conceptual illustration of an instrumented arrester 10B including an internal block temperature sensor/transmitter 50 using a wireless link 51 to communicate with a visual over-temperature indicator 52. This embodiment is similar to the instrumented electric power voltage arrester 10A shown in FIG. 1, except that the disk-type sensor/transmitter 12 is replaced by the sensor/transmitter 50. This sensor/transmitter may be built into a varister block or an inoperative "dummy block" having a similar size as a varister block. This allows the internal block temperature sensor/transmitter 50 to replace a varister block or be added to the varsister stack inside the arrester. This example illustrates a voltage pickup including an outer voltage gradient electrode 54 radially spaced apart from an inner voltage gradient electrode 55. Some of the conventional components 56 of the arrester are also shown, including in the inner core 57a, insulator housing 57b, outer tube 57c, varister disks 57d, spacers 57e, the spring 57f compressing the varister stack, and the diaphragm and seals 57g at the bottom of the arrester.

Figure 6:
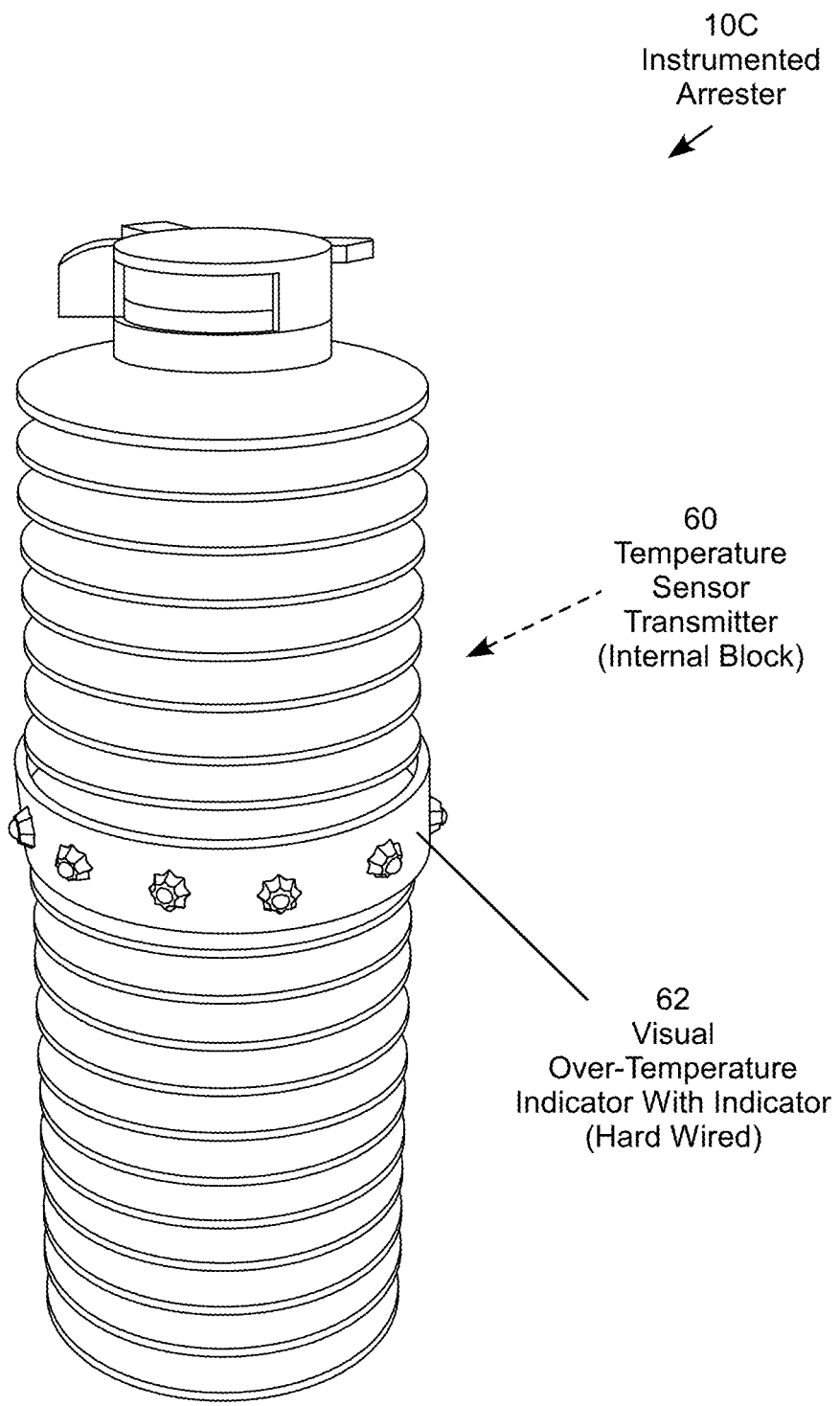
FIG. 6 is conceptual illustration of an instrumented electric power voltage arrester including an internal block temperature transmitter/sensor with a hard-wired visual over-temperature indicator.

FIG. 6 shows another alternative instrumented arrester 10C, in which the internal block sensor/transmitter 60 is hard-wired to the visual indicator 62. This configuration allows a harvesting power supply on the PC board of the sensor/transmitter to supply signal and electric power to the visual indicator.

Figure 7:
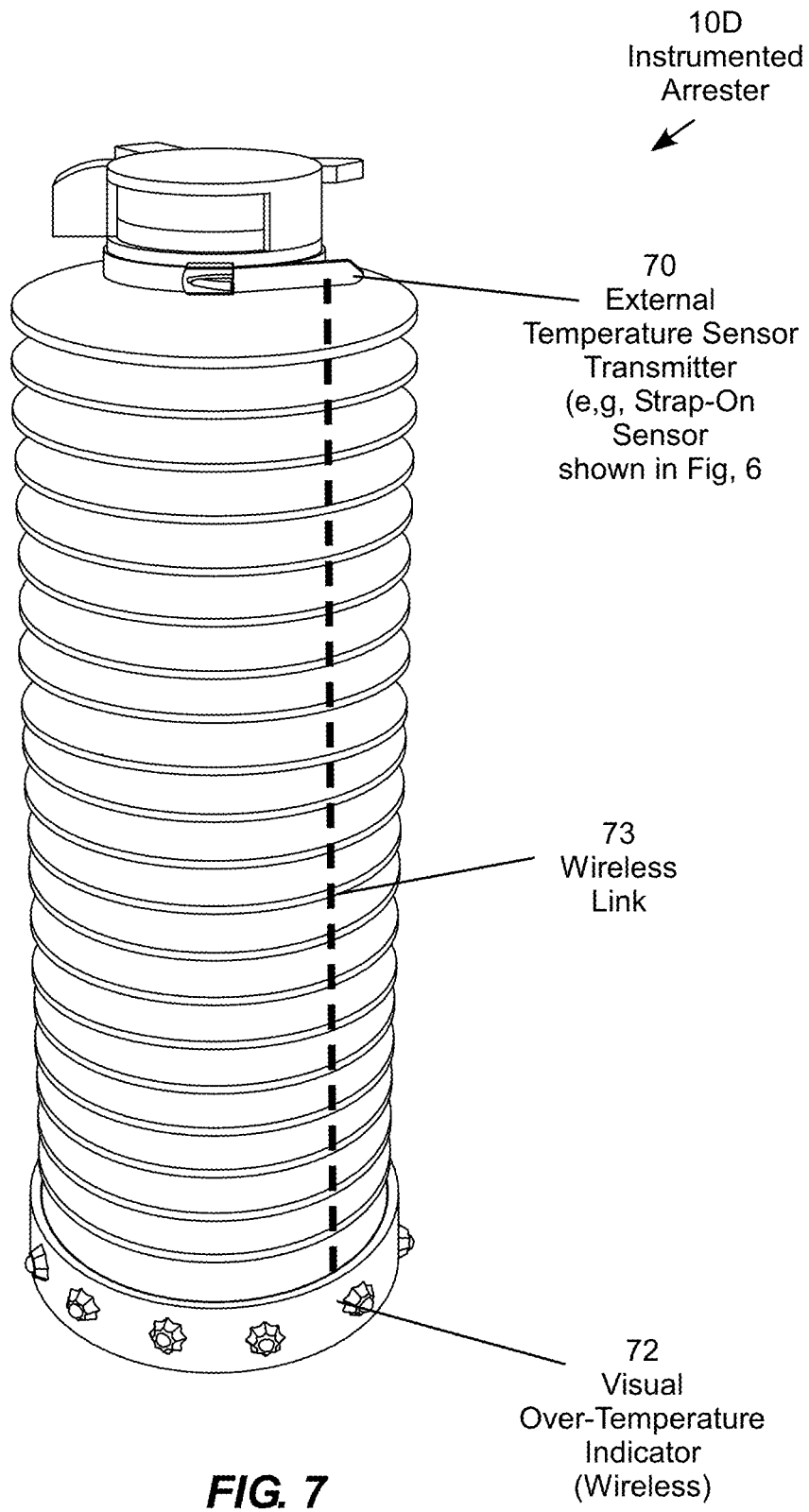
FIG. 7 is conceptual illustration of an instrumented electric power voltage arrester including an external strap-on temperature transmitter/sensor positioned near the end of an arrester.

FIG. 7 shows another alternative instrumented arrester 10D, which includes an external strap-on sensor-transmitter 70 that communicates with a visual indicator 72 over a wireless link 73. In this embodiment, the sensor-transmitter 70 and indicator 72 strap on at opposing ends of the arrester, which is convenient for adding these components to an existing arrester without having to take the arrester out of service.

Figure 8A:
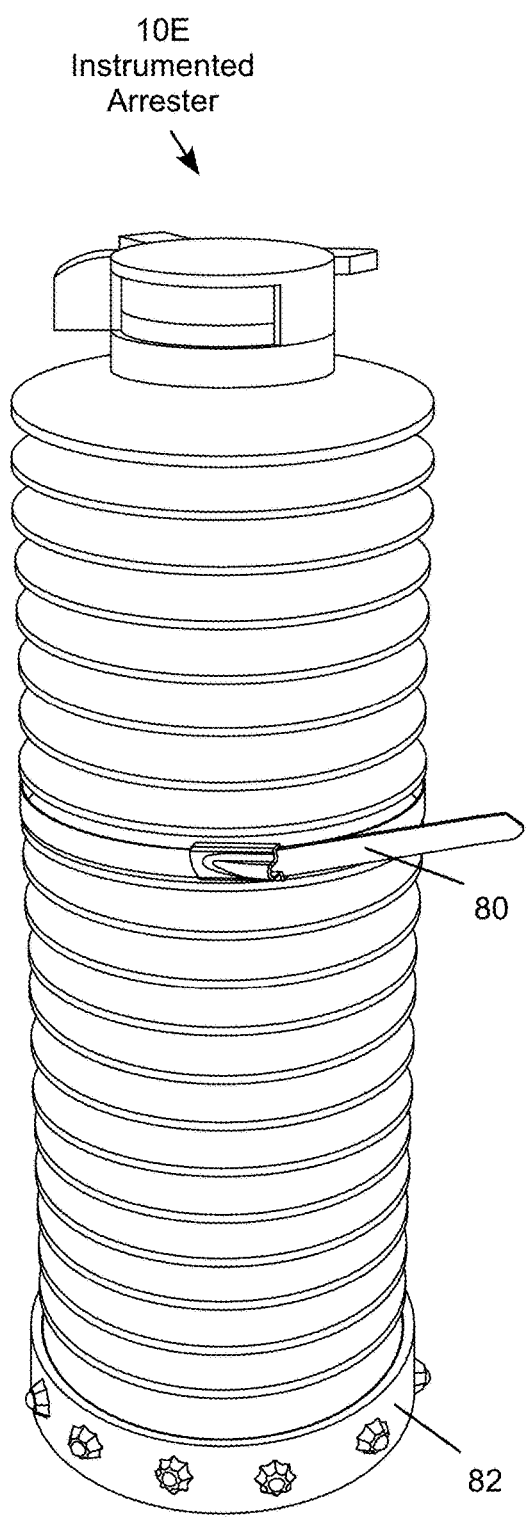
FIG. 8A is conceptual illustration of an instrumented electric power voltage arrester including an external strap-on temperature transmitter/sensor positioned near the center of the electric power voltage arrester.
Figure 8B:
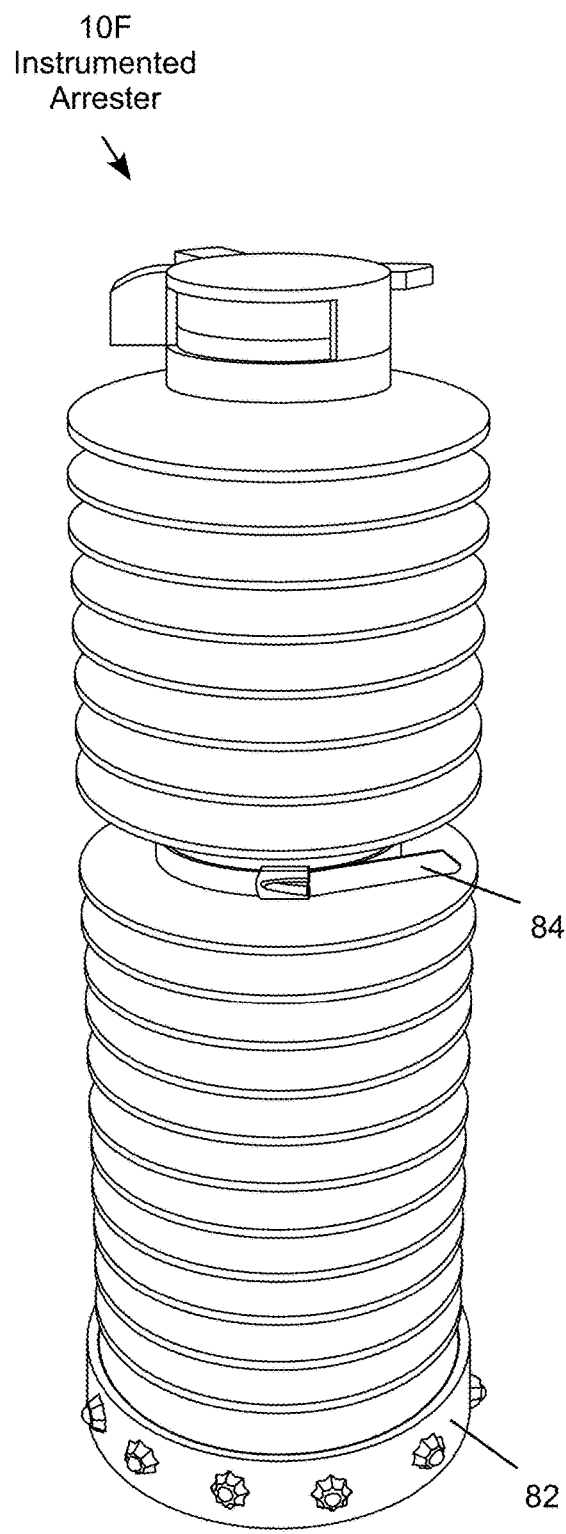
FIG. 8B is conceptual illustration of an alternative instrumented electric power voltage arrester including an external strap-on temperature transmitter/sensor positioned near the center of the electric power voltage arrester.

FIG. 8A shows another alternative instrumented arrester 10E that communicates with a visual indicator 82. In this embodiment, the strap-on sensor-transmitter 80 is attached at the center of the arrester, which may be a better location for detecting temperature increases caused by increases in the leakage current through the arrester. FIG. 8B shows another alternative where the arrester has a fin-free section near the center to accommodate an external sensor/transmitter 84 positioned closer to the varisters inside the arrester. The visual indicator and transmitter/sensor may be located in any desired position and communicate with the visual indicator wirelessly or through a wired connection, directly or indirectly, as a matter of design choice.

Figure 9:
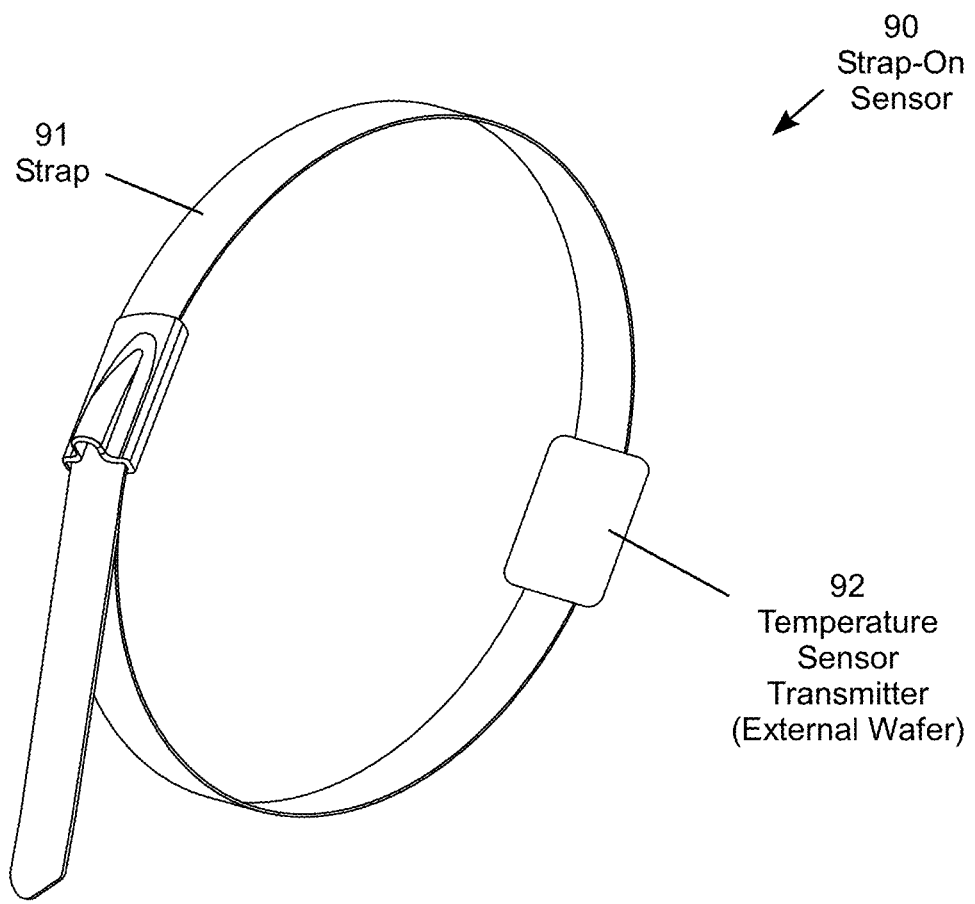
FIG. 9 is conceptual illustration of a strap-on transmitter/sensor for an electric power voltage arrester.

FIG. 9 is conceptual illustration of a strap-on temperature sensor 90 for an electric power voltage arrester. This particular embodiment includes a stainless steel strap 91 and a tag-style temperature sensor/transmitter 92 configured to be strapped onto the outside of the arrester. While the stainless steel strap 91 is depicted for this embodiment, any other suitable type of strap may be used as a matter of design choice. For example, one option is a resilient band that can be twisted or stretched to fit onto the arrester. Another option is a two-piece bracelet style with a hinge and hasp. Another option is a half-circle rigid band with eyelets on either end fastened to the arrester with a heavy duty cable tie, Velcro strap or band clamp. Another option is two half-circle rigid bands that snap fit into each other. A mechanism may be provided to tighten the strap, such as a band clamp or ratchet. Any other suitable attachment mechanism may be used as a matter for design choice.

Figure 10:
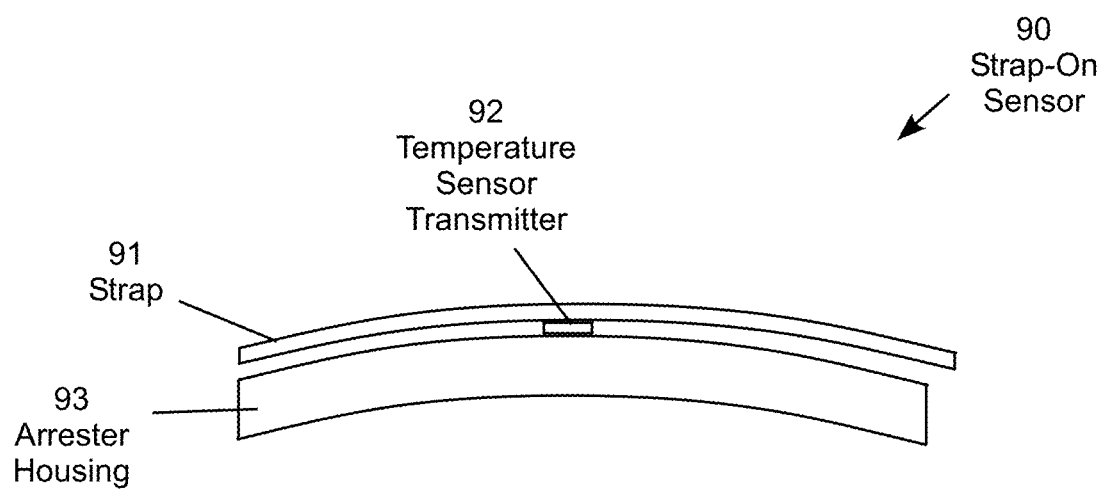
FIG. 10 is a conceptual side view of the strap-on transmitter/sensor.

FIG. 10 is a conceptual side view of the strap-on temperature sensor 90 connected to an arrester housing 93. The strap 91 holds the sensor/transmitter 92 firmly against the arrester housing 93 to ensure a reliable temperature measurement. A mechanism may be provided to tighten the strap, such as a band clamp or ratchet.

Figure 11:
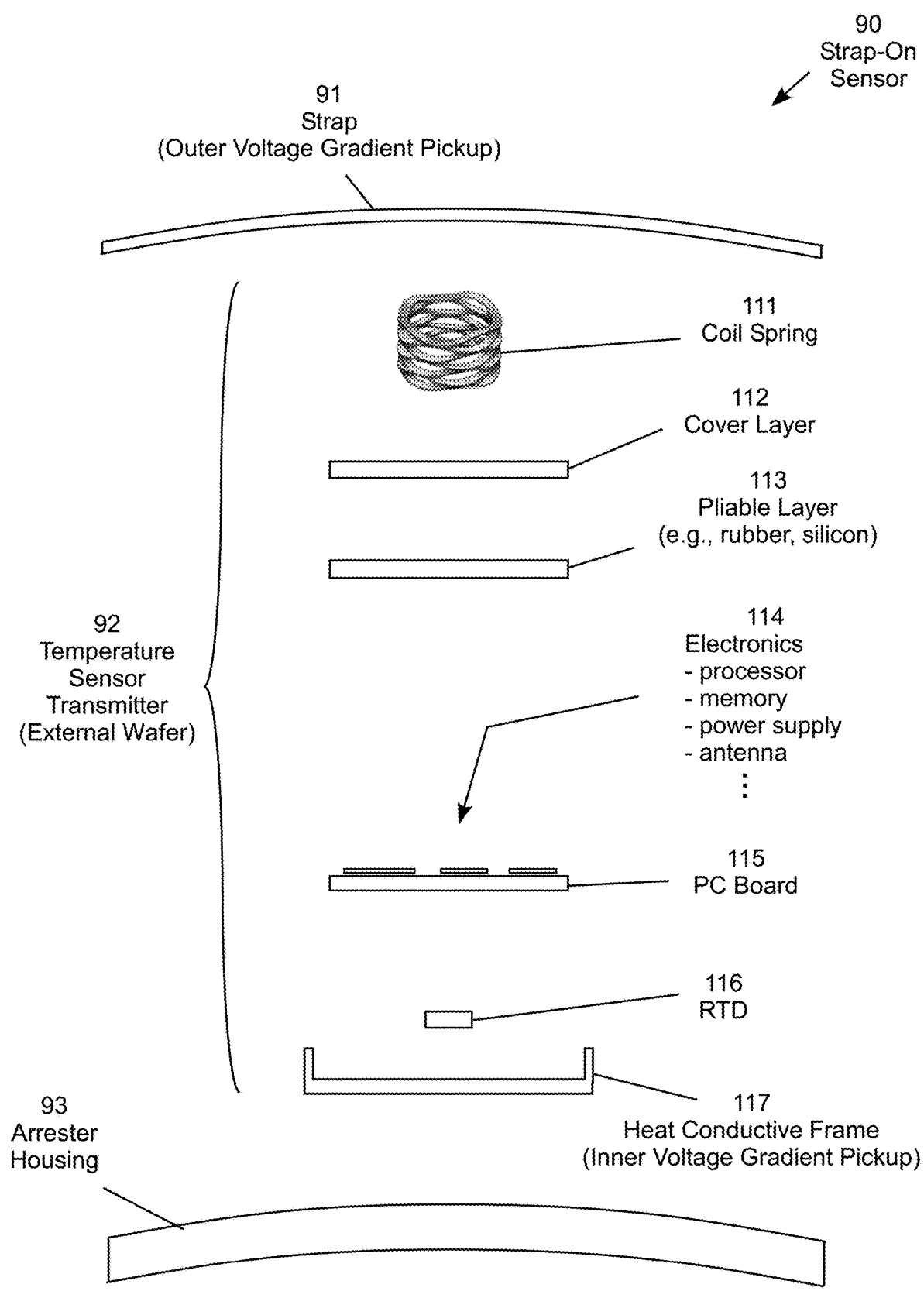
FIG. 11 is a conceptual exploded view of the strap-on transmitter/sensor.

FIG. 11 is a conceptual side exploded view of the strap-on temperature sensor 90 in which the stainless steel strap 91 holds the tag-style transmitter/sensor 92 in place. Unlike the embodiments that are located inside the arrester, this alternative may include a coil spring 111 to compress the sensor toward the arrester. Other compression devices may be used, such as replacing the band clamp with a stainless steel strap 91 or a strap with a ratchet. A plastic or other firm dielectric cover 112 is located under the coil spring 111 to distribute the compression pressure applied by the coil spring and keep ware out of the transmitter sensor. A pliable layer 113, such as rubber, neoprene or silicon, is located under the cover 112 to protect the underlying electronics. A PC board 115 carrying electronics 114 is located under the pliable layer 113. The electronics 114 typically include a processor, wireless transmitter, memory, harvesting power supply, transmit capacitor, patch antenna, and so forth. A temperature sensor, such as a resistance temperature detector (RTD), is located under the PC board 115. The temperature sensor may be an RTD, surface acoustic wave (SAW), thermocouple, or any other suitable type of temperature sensor. A heat conductive frame 117, such as an aluminum frame, is located under the temperature sensor. The coil spring 111 compresses the heat conductive frame 117 against the arrester housing 93 for a reliable temperature measurement.

Figure 12:
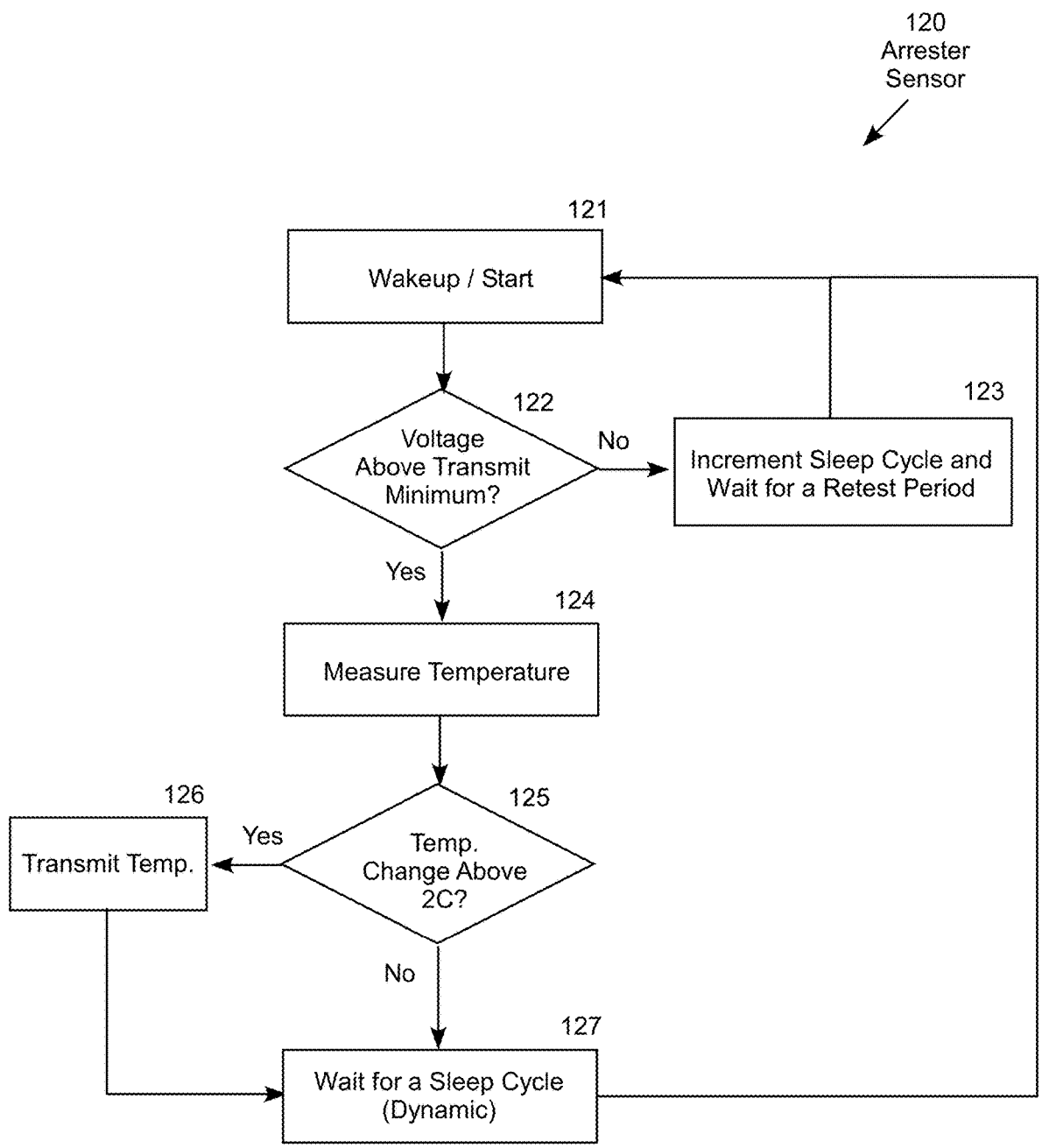
FIG. 12 is a logic flow diagram illustrating a method for operating a temperature transmitter/sensor for an electric power voltage arrester.

FIG. 12 is a logic flow diagram 120 illustrating a method for operating a temperature sensor/transmitter for an electric power voltage arrester. This routine dynamically sets the sleep cycle based on the experienced charging time of the transmit capacitor used to power short-burst wireless data transmissions. This allows the sensor/transmitter to automatically adjust to the performance of the harvesting power supply used to charge the transmit capacitor. In step 121, the sensor/transmitter starts or wakes up after a sleep cycle. Step 121 is followed by step 122, in which the sensor/transmitter determines whether the transmit capacitor has been charged up to a minimum transmission threshold. If the transmit capacitor has not been charged up to a minimum transmission threshold, the "No" branch is followed to step 123, in which the sensor/transmitter increments the sleep cycle so that that the transmit capacitor will charge for a longer period during the next cycle. For example, the sleep cycle increment may be set to ten percent (10%) of the previous sleep cycle setting or another duration as a matter of design choice. The sensor/transmitter then waits for a reset period before returning to step 121. The reset period may also be set to ten percent (10%) of the previous sleep cycle setting or another duration as a matter of design choice.

If the transmit capacitor has been charged up to a minimum transmission threshold, the "Yes" branch is followed from step 122 to step 124, in which the sensor/transmitter records a temperature measurement. Step 124 is followed by step 125, in which the sensor/transmitter determines whether the temperature change since the previous temperature measurement is above a preset threshold, such as two degrees Celsius (2° C.). If the temperature change since the previous temperature measurement is above the preset threshold, the "Yes" branch is followed to step 126, in which the sensor/transmitter transmits the measured temperature. If the temperature change since the previous temperature measurement is not above the preset threshold, the "No" branch is followed to step 127, in which the sensor/transmitter waits for a sleep cycle. Step 127 is followed by step 121, in which the sensor/transmitter wakes up for another transmit cycle.

Is should be noted that the temperature change in step 125 may be an independent measurement of the sensor/transmitter or a relative measurement of the sensor/transmitter with respect to the ambient temperature measurement. For example, sensor/transmitters located inside the arrester may use an independent temperature measurement, while sensor/transmitters located outside the arrester may use a relative temperature measurement. A weighted sum of the sensor/transmitter temperature measurement and the ambient temperature measurement, a temperature dependent scale of weighting factors, or another determined combination may be used based on calibration of the sensor/transmitter.

Figure 13:
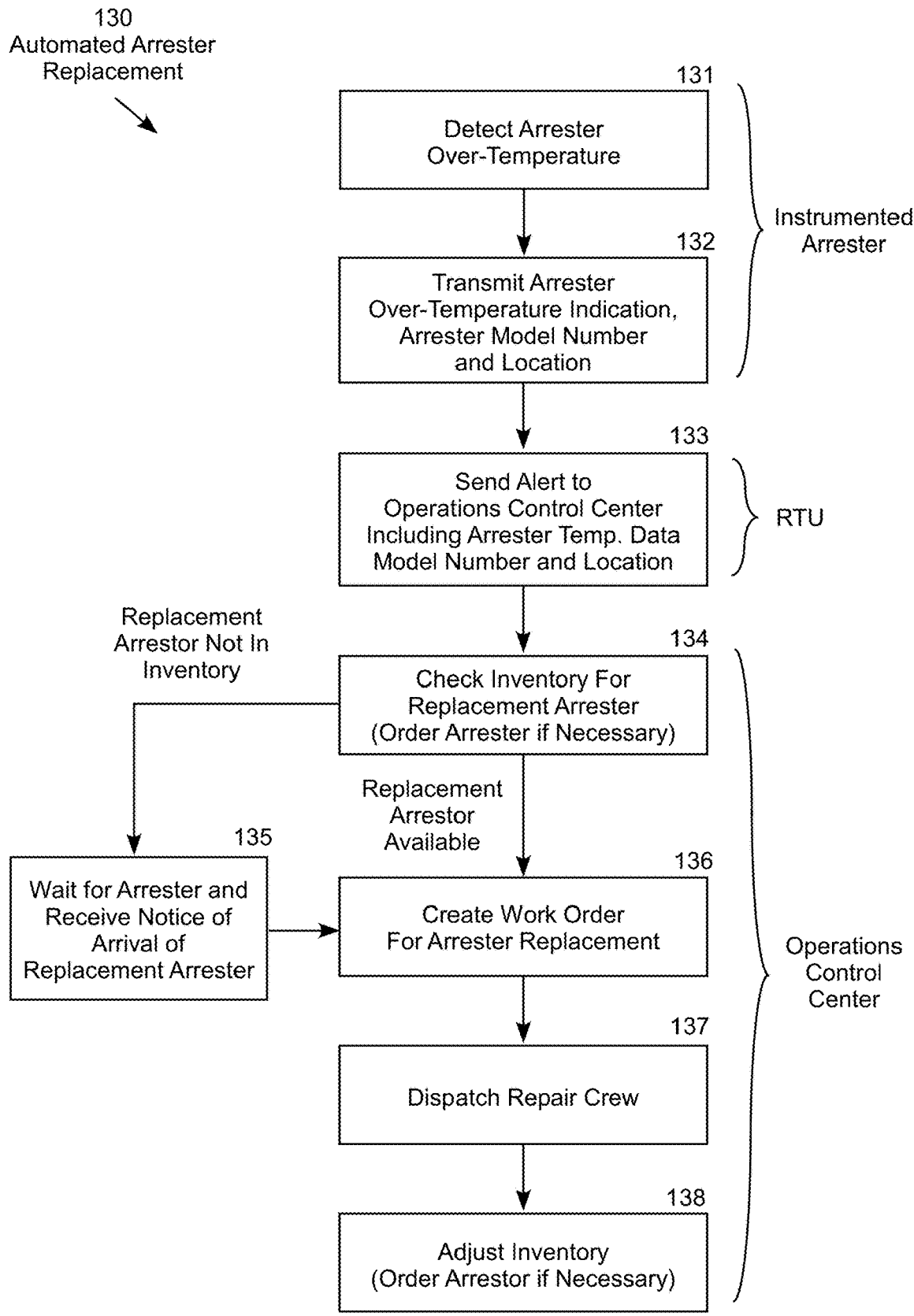
FIG. 13 is a logic flow diagram illustrating a method for scheduling replacement for an electric power voltage arrester.

FIG. 13 is a logic flow diagram 130 illustrating a method for scheduling replacement for an electric power voltage arrester, which may be performed in part by the sensor/transmitter, an RTU in communication with the sensor/transmitter, an operations control center, or any other suitable maintenance scheduling component in the electric power operations and maintenance system. Typically, the computations are distributed as shown in FIG. 13, but this distribution is merely illustrative as computer intelligence can be located in different components as a matter of design choice.

In step 131, the instrumented arrester detects an over-temperature condition. Step 131 is followed by step 132, in which the instrumented arrester transmits an over-temperature indication along with the arrester model number and location to the RTU. Step 132 is followed by step 133, in which the RTU sends an alert to the operations control center including the arrester model number and location. Step 133 is followed by step 134, in which the operations control center checks the inventory for a replacement arrester and orders a replacement arrester if necessary. If a replacement arrester has to be ordered, step 134 is followed by step 135, in which the operations control center waits for a notice of arrival of the replacement arrester. Steps 134 and 135 are followed by step 136, in which the operations control center creates a work order for replacement of the arrester. Step 136 is followed by step 137, in which a repair crew is dispatched to replace the arrester at a convenient time, such as an off-peak, night or weekend period. Step 136 is followed by step 137, in which the operations control center adjusts the inventory and orders a replacement arrester if appropriate.

Figure 14:
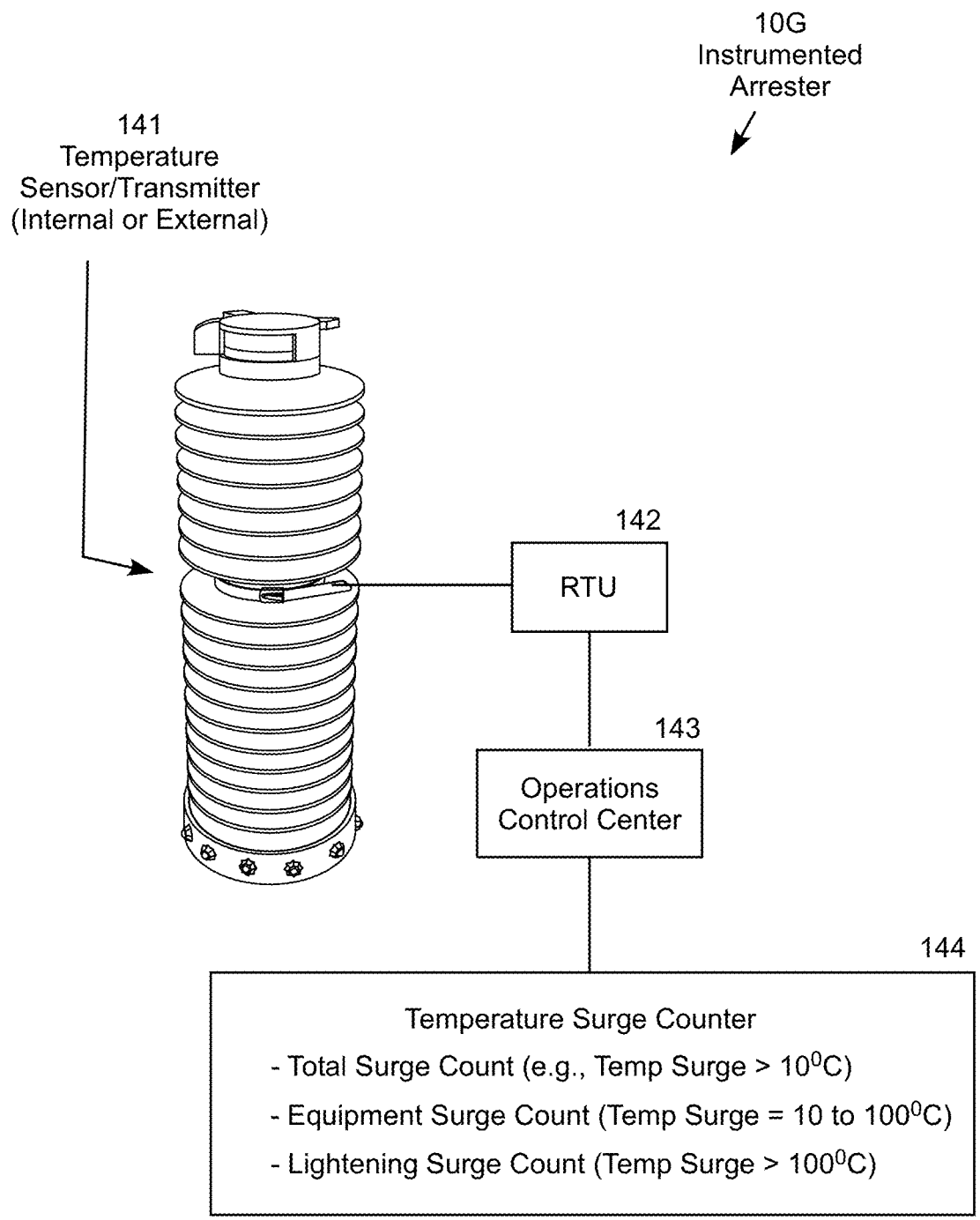
FIG. 14 is conceptual illustration of an instrumented electric power voltage arrester including a temperature transmitter/sensor and a surge counter.

FIG. 14 is conceptual illustration of an instrumented electric power voltage arrester 10G including a temperature transmitter/sensor 141 and a surge counter 144. In this example, the surge counter 144 is located in an operations control center 143 that receives the arrester monitoring data from the temperature transmitter/sensor 141 by way of an RTU 142. The RTU is located nearby the arrester, while the operations control center is located remotely and used for monitoring and controlling a large number of instrumented arresters throughout the system. This is merely one possible configuration, as the software for the surge counter can be located in any desired location, including the transmitter/sensor 141, the RTU 142 or any other desired location. Although an external transmitter/sensor 141 is depicted in FIG. 14, the surge counter 144 may be used with any type of internal or external transmitter/sensor. The transmitter/sensor typically communicates wirelessly with the RTU, which communicates with the operations control center 143 over a SCADA link. Wired, wireless and SCADA communication links may be utilized as a matter of design choice.

Conventional lightning counters utilize current measurements, which requires relatively expensive current sensors (known as current transformers or CTs) to be installed at each monitored arrester. The temperature transmitter/sensor 141 provides a lower cost equivalent because arrester temperature surges are invariably caused by current surges counted by the surge counter 144. In addition to counting the total number of surge events, the surge counter 144 can discriminate between equipment related current surges, such as switching and line shorts that cause arrester temperature surges on the scale of tens of degrees, versus lightning related surges that cause arrester temperature surges on the scale of hundreds of degrees. To do so, a surge detection system utilizes an equipment surge detection temperature change threshold $T_S$ (e.g., $T_S=10°$ C.) and a lightning surge detection temperature change threshold $T_L$ (e.g., $T_L=100°$ C.). The total surge count is the number of surge detection events in which the detected temperature change is greater than $T_S$ (e.g., temp. change>10° C.). The equipment related surge count is the number of surge detection events in which the detected temperature change is greater than $T_S$ (e.g., temp. change>10° C.) and less than the $T_L$ (e.g., temp. change<100° C.). A lightning related surge count is the number of surge detection events in which the detected temperature change is greater than $T_L$ (e.g., temp. change>100° C.). The illustrated threshold temperature thresholds are merely illustrative and may vary based on the ambient conditions, the type of arrester, the type of sensor/transmitter, the operating voltage, and so forth.

In view of the foregoing, it will be appreciated that present invention provides significant improvements in monitoring and response systems for electric power voltage arresters. The foregoing relates only to the exemplary embodiments of the present invention, and that numerous changes may be made therein without departing from the spirit and scope of the invention as defined by the following claims.

The invention claimed is:

1. A temperature sensor/transmitter for an electric power voltage arrester comprising an outer insulator housing extending radially from an inner core, comprising:
an energy harvesting power supply, comprising an inner voltage gradient pickup configured for attachment against the outer insulator housing, and an outer voltage gradient pickup configured for attachment radially spaced apart from the inner voltage gradient pickup;
electronics positioned between and configured to receive electric power from the inner and outer voltage gradient pickups, comprising a temperature detector, a processor, a memory, a wireless transmitter, a transmit capacitor, and an antenna;
wherein the inner voltage gradient pickup comprises a heat conductive frame, and the electronics comprise a resistance temperature detector positioned against the heat conductive frame.

2. The temperature sensor/transmitter of claim 1, wherein the outer voltage gradient pickup comprises a strap for attaching the temperature sensor/transmitter to the outer insulator housing of the electric power voltage arrester.

3. The temperature sensor/transmitter of claim 1, further comprising a visual indicator positioned on the outer insulator housing in communication with the electronics operative to indicate an over-temperature condition detected by the electronics.

4. The temperature sensor/transmitter of claim 1, further comprising a surge counter configured to count a number of temperature surges experienced by the arrester.

5. The temperature sensor/transmitter of claim 1, wherein the processor implements a dynamic data transmission cycle that automatically adjusts to a time required to harvest transmission power.

6. The temperature sensor/transmitter of claim 1, wherein the electronics comprises a PC board carrying the processor, the memory, the wireless transmitter, the transmit capacitor, and the antenna positioned between the inner and outer voltage gradient pickups.

7. The temperature sensor/transmitter of claim 1, further comprising a spring positioned between the inner and outer voltage gradient pickups.

8. The temperature sensor/transmitter of claim 7, further comprising a pliable layer positioned between the spring and the inner voltage gradient pickup.

9. The temperature sensor/transmitter of claim 8, further configured to communicate with a visual indicator configured for attachment to the outside of the electric power voltage arrester.

10. An instrumented electric power voltage arrester, comprising:
an electric power voltage arrester comprising an outer insulator housing extending radially from an inner core configured, comprising; and
a temperature sensor/transmitter, comprising:
an energy harvesting power supply, comprising an inner voltage gradient pickup attached against the outer insulator housing, and an outer voltage gradient pickup radially spaced apart from the inner voltage gradient pickup,
electronics positioned between and receiving electric power from the inner and outer voltage gradient pickups, comprising a temperature detector, a processor, a memory, a wireless transmitter, a transmit capacitor, and an antenna;
wherein the inner voltage gradient pickup comprises a heat conductive frame, and the electronics comprise a resistance temperature detector positioned against the heat conductive frame.

11. The instrumented electric power voltage arrester of claim 10, wherein the outer voltage gradient pickup comprises a strap attaching the temperature sensor/transmitter to the outer insulator housing of the electric power voltage arrester.

12. The instrumented electric power voltage arrester of claim 10, wherein the inner voltage gradient pickup further comprises a spring positioned between the outer voltage gradient pickup and the resistance temperature detector.

13. The instrumented electric power voltage arrester of claim 10, wherein the processor implements a dynamic data transmission cycle that automatically adjusts to a time required to harvest transmission power.

14. The temperature sensor/transmitter of claim 10, further comprising a surge counter configured to count a number of temperature surges experienced by the electric power voltage arrester.

15. The temperature sensor/transmitter of claim 14, further comprising a visual indicator in wireless communication with the antenna.

16. An electric power operation and maintenance system, comprising:
  an instrumented electric power voltage arrester connected to an electric power line, comprising:
    an energy harvesting power supply, comprising an inner voltage gradient pickup attached against an outer insulator housing, and an outer voltage gradient pickup radially spaced apart from the inner voltage gradient pickup,
    electronics positioned between and receiving electric power from the inner and outer voltage gradient pickups, comprising a temperature detector, a processor, a memory, a wireless transmitter, a transmit capacitor, and an antenna,
    wherein the inner voltage gradient pickup comprises a heat conductive frame, and the electronics comprise a resistance temperature detector positioned against the heat conductive frame;
  an operations control system located remotely from the instrumented electric power voltage arrester configured to receive over-temperature indications from the instrumented electric power voltage arrester and schedule replacement the instrumented electric power voltage arrester in response to the over-temperature indications.

17. The electric power operation and maintenance system of claim 16, wherein the outer voltage gradient pickup comprises a strap attaching the temperature sensor/transmitter to the outer insulator housing of the electric power voltage arrester.

18. The electric power operation and maintenance system of claim 16, wherein the inner voltage gradient pickup further comprises a spring positioned between the outer voltage gradient pickup and the resistance temperature detector.

19. The electric power operation and maintenance system of claim 16, wherein the processor implements a dynamic data transmission cycle that automatically adjusts to a time required to harvest transmission power.

20. The electric power operation and maintenance system of claim 19, further comprising a visual indicator in wireless communication with the antenna.

* * * * *